(12) United States Patent
Jiang et al.

(10) Patent No.: US 6,514,795 B1
(45) Date of Patent: Feb. 4, 2003

(54) PACKAGED STACKED SEMICONDUCTOR DIE AND METHOD OF PREPARING SAME

(75) Inventors: Tongbi Jiang, Boise, ID (US); Michael E. Connell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/974,192

(22) Filed: Oct. 10, 2001

(51) Int. Cl.[7] .......................... H01L 21/44; H01L 21/48; H01L 21/50

(52) U.S. Cl. ...................... 438/113; 438/460; 438/464; 438/109; 438/114

(58) Field of Search .............................. 438/113, 460, 438/464, 109, 114

(56) References Cited

U.S. PATENT DOCUMENTS 5,411,921 A * 5/1995 Negoro ........................ 437/217
5,882,956 A * 3/1999 Umehara et al. ............ 438/114

* cited by examiner

Primary Examiner—Albert W. Paladini
Assistant Examiner—David A. Zarneke

(74) Attorney, Agent, or Firm—Williams, Morgan & Amerson, P.C.

(57) ABSTRACT

A method of packaging semiconductor devices is described. In one embodiment, the method comprises providing a section of wafer mount tape, applying an adhesive layer to the wafer mount tape, stretching the wafer mount tape and the adhesive layer, attaching a wafer to the stretched adhesive layer, cutting the wafer and the adhesive layer, the wafer being cut into a plurality of die, and curing the wafer mount tape. In further embodiments, the method comprises removing at least one of the plurality of die from the wafer mount tape, the removed die having a portion of the adhesive layer coupled thereto, providing a die having a plurality of wire bonds coupled thereto, and coupling the adhesive layer on the removed die to the die having the wire bonds coupled thereto. In another aspect, the present invention is directed to a plurality of stacked semiconductor devices that comprise a first die, the first die having an upper surface, a second die positioned above the first die, the second die having a bottom surface, and an adhesive layer positioned between and coupled to each of the first die and the second die, the adhesive layer comprised of first and second surfaces, the first surface of the adhesive layer being coupled to the bottom surface of the second die thereby defining a first contact area, the second surface of the adhesive layer being coupled to the upper surface of the first die thereby defining a second contact area, the second contact area being less than the first contact area.

24 Claims, 5 Drawing Sheets

$$y(x,\theta) := \frac{x}{\cos(\theta)} \cdot \sin(\theta)$$

$$x(yy,\theta) := \frac{yy}{\sin(\theta)} \cdot \cos(\theta) \qquad yy = 100, 110 .. 400$$

PACKAGED STACKED SEMICONDUCTOR DIE AND METHOD OF PREPARING SAME

BACKGROUND OF THE INVENTION

1. Field of the Invention

This invention relates generally to semiconductor packaging technology, and, more particularly, to a packaged stacked semiconductor die and a method of preparing same.

2. Description of the Related Art

Integrated circuit devices proceed through a complicated and time-consuming fabrication routine before being completed and ready for packaging. Once an integrated circuit device passes final inspection, it is passed to packaging. The integrated circuit device (IC) then is typically encapsulated in a protective package made of plastic, metal, ceramic material, or combinations thereof. The package is sealed to insulate the semiconductor die from the effects of temperature extremes, humidity and unintentional electrical contacts. The package has a plurality of conductive leads protruding from the encapsulation material for connecting to external devices on a printed circuit board. Various types of semiconductor packages include sealed metal cans, plastic and ceramic dual in-line packages, small outlining packages, single in-line packages, surface mount packages, and various other flat packages.

There is a need to increase the semiconductor die density of a semiconductor package to include two or more semiconductor dice in one package. A high density package, having multiple semiconductor die therein, increases the electronic component density on a printed circuit board. Such a high density semiconductor package also maximizes space utilization on a printed circuit board and further increases the number of active elements on the printed circuit board.

In such stacked die arrangements, particularly of die of approximately the same size, there must be sufficient clearance between the top surface of the bottom die and the bottom surface of the top die for the wire bonds affixed to bonding pads on the top of the bottom die. For example, in some prior art packaging techniques, a spacer comprised of an adhesive-type material is positioned between the top and bottom die. The spacer has a thickness sufficient to provide the necessary mechanical clearance, e.g., 75–175 µm, for the wire bonds coupled to the bottom die. The spacer is sized such that it does not cover any of the bonding pads on the top surface of the bottom die. That is, the spacer has a surface area that is less than the surface area of the die it is positioned between. Accordingly, sufficient mechanical clearance is provided for the wire bonds on the bottom die due to the reduced size of the spacer and its thickness. Alternatively, a similar type spacer comprised of silicon may be positioned between the top die and bottom die and attached to each of them with an adhesive paste. However, given the constant drive to increase manufacturing efficiencies, a need exists for a more efficient stacked die packaging apparatus and method.

The present invention is directed to overcoming, or at least reducing the effects of, one or more of the problems described above.

SUMMARY OF THE INVENTION

In general, the present invention is directed to a method for packaging stacked die. In one illustrative embodiment, a method disclosed herein comprises providing a section of wafer mount tape, applying an adhesive layer to the wafer mount tape, stretching the wafer mount tape and the adhesive layer, attaching a wafer to the stretched adhesive layer, cutting the wafer and the adhesive layer, the wafer being cut into a plurality of die, and curing the wafer mount tape. In further embodiments, the method comprises removing at least one of the plurality of die from the wafer mount tape, the removed die having a portion of the adhesive layer coupled thereto, providing a die having a plurality of wire bonds coupled thereto, and coupling the adhesive layer on the removed die to the die having the wire bonds coupled thereto.

In another aspect, the present invention is directed to a plurality of stacked semiconductor devices that comprise a first die, the first die having an upper surface, a second die positioned above the first die, the second die having a bottom surface, and an adhesive layer positioned between and coupled to each of the first die and the second die, the adhesive layer comprised of first and second surfaces, the first surface of the adhesive layer being coupled to the bottom surface of the second die thereby defining a first contact area, the second surface of the adhesive layer being coupled to the upper surface of the first die thereby defining a second contact area, the second contact area being less than the first contact area. In further embodiments, the second surface of the adhesive layer has a lateral dimension that is less than a lateral dimension of the first surface of the adhesive layer.

BRIEF DESCRIPTION OF THE DRAWINGS

The invention may be understood by reference to the following description taken in conjunction with the accompanying drawings, in which like reference numerals identify like elements, and in which.

Figure 1:
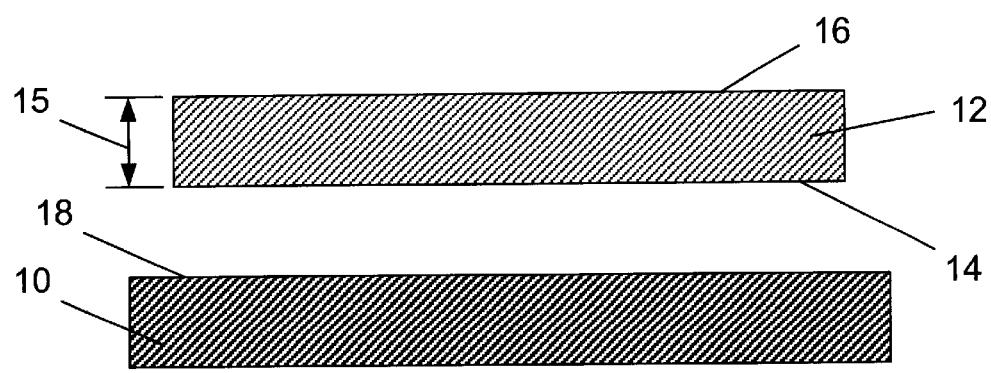
FIGS. 1 and 2 are cross-sectional views of a section of wafer mount tape and an adhesive layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and structures depicted in the drawings may be exaggerated or reduced as compared to the size of those features or structures on real-world devices. Nevertheless, the attached drawings are included to describe and explain illustrative examples of the present invention.

In general, the present invention is directed to a packaged stacked semiconductor die and a method of preparing same. As will be readily apparent to those skilled in the art upon a complete reading of the present application, the present invention is applicable to the packaging of a variety of different types and shapes of semiconductor devices, and it is readily applicable to a variety of devices, including, but not limited to, logic devices, memory devices, etc. The present invention will now be described with reference to the attached drawings. However, it should be understood that particular details and applications described herein are illustrative in nature. Thus, the present invention should not be considered as limited to the disclosed details unless such limitations are clearly recited in the appended claims.

Figure 2:
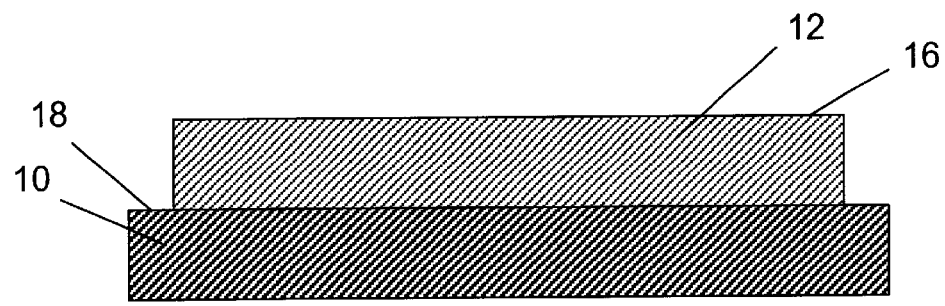

As shown in FIGS. 1 and 2, an adhesive layer 12 is coupled to a section of wafer mount tape 10. The wafer mount tape 10 may be comprised of any of a variety of such commercially available tapes. For example, the wafer mount tape 10 may be comprised of an elastomeric type of material. The wafer mount tape 10 is of a type that may be cured with UV (ultraviolet) radiation.

The adhesive layer 12 may be either a film-type adhesive or it may be a liquid-type adhesive that is applied to the surface 18 of the wafer mount tape 10 and thereafter cured. Moreover, the adhesive layer 12 may be comprised of a single layer of material or, in some embodiments, it may be comprised of multiple layers. In the case where the adhesive layer 12 is a film-type material, it may have surfaces 14, 16 that are both adhesive. In that situation, the surface 14 of the adhesive layer 12 may be engaged with the surface 18 of the wafer mount tape 10. Alternatively, or in addition to, an adhesive paste material (not shown) may be applied between the adhesive layer 12 and the wafer mount tape 10 to secure the adhesive layer 12 to the wafer mount tape 10. The original thickness 15 of the adhesive layer 12 may vary depending upon the particular application. For example, the thickness of the adhesive layer 12 may vary between approximately 75–250 $\mu$m (3–10 mils). In one particular embodiment, the adhesive layer 12 is a film manufactured by Dow Corning under the trade name FA-60.

Figure 3:
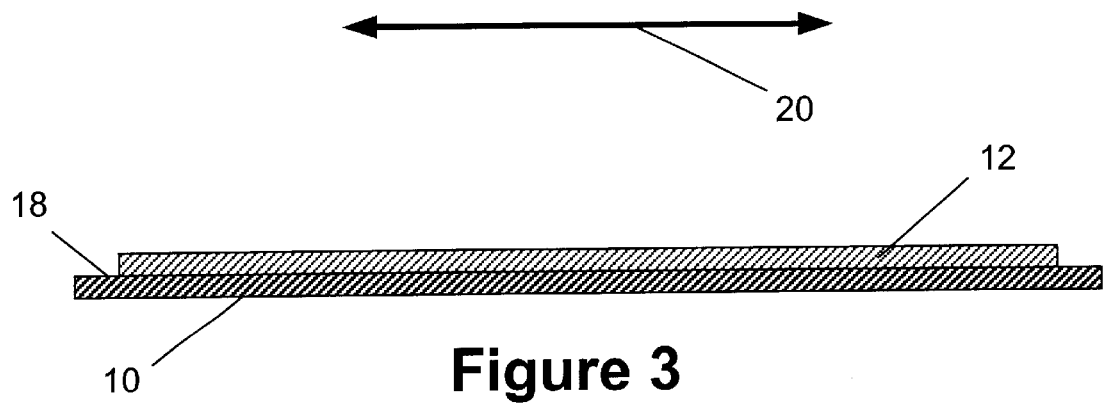
FIG. 3 is a cross-sectional view of the wafer mount tape and adhesive layer after stretching.

Next, as shown in FIG. 3, after the adhesive layer 12 is attached to the wafer mount tape 10, the combination of the wafer mount tape 10 and adhesive layer 12 is stretched. The stretching may occur in a variety of directions, such as in the direction indicated by the double arrow labeled 20. The stretching may be performed on a device similar to one used on known die attach machines. The amount or degree of stretching of the wafer mount tape 10 and adhesive layer 12 may vary depending upon the particular application. For example, in one illustrative embodiment, the stretching may be performed such that the wafer mount tape 10 and adhesive layer 12 are elongated by approximately 300–800%. By way of example only, the wafer mount tape 10 and adhesive layer 12 may be stretched in two directions (as illustrated by the arrow 20) or in four directions.

Figure 4:
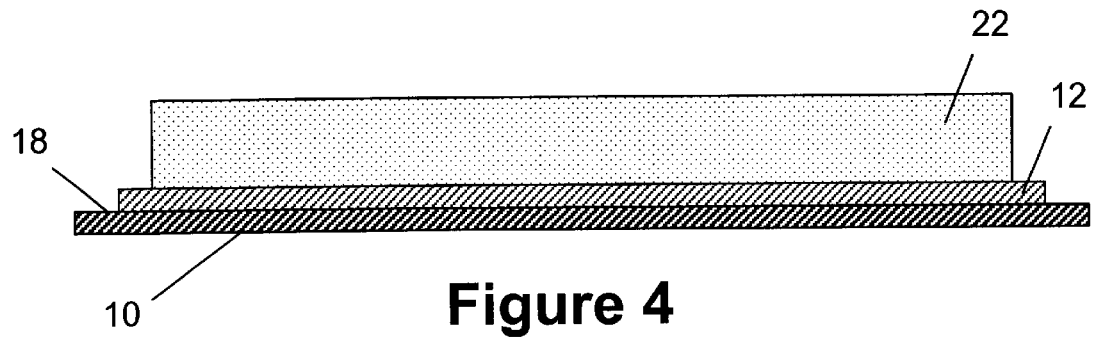
FIG. 4 is a cross-sectional view depicting a wafer being positioned in contact with the stretched adhesive layer depicted in FIG. 3.
Figure 5:
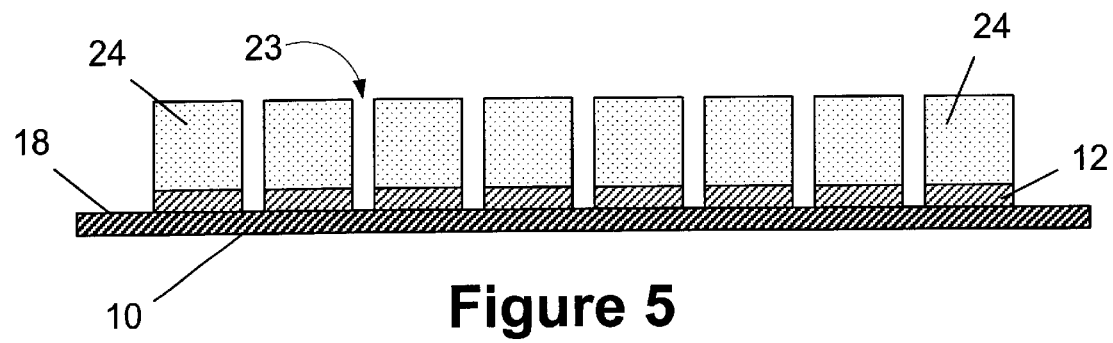
FIG. 5 depicts the structure of FIG. 4 after the wafer has been sliced into individual die.
Figure 6:
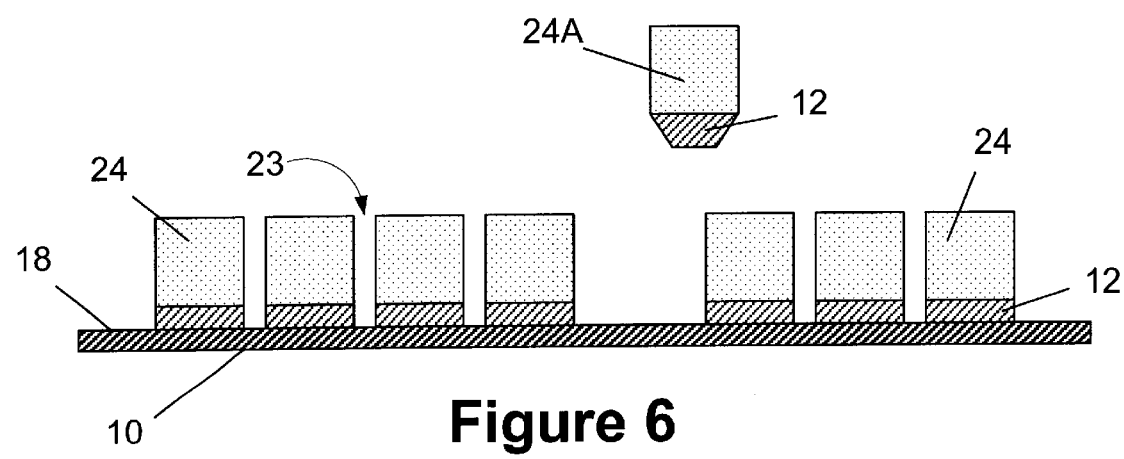
FIG. 6 illustrates a die being removed from the wafer mount tape after UV cure.

Then, as shown in FIG. 4, a wafer 22 is attached to the stretched adhesive layer 12. An adhesive paste may or may not be used in securing the wafer 22 to the stretched adhesive layer 12. Thereafter, as shown in FIG. 5, using traditional dicing equipment, a sawing operation is performed to separate the wafer 22 into a plurality of individual die 24. During this sawing process, the adhesive layer 12 is also cut, but the wafer mount tape 10 remains intact. Next, as shown in FIG. 6, using traditional techniques and systems, the wafer mount tape 10 is cured by exposure to UV energy, thereby substantially reducing the adhesive nature of the wafer mount tape 10.

Figure 7:
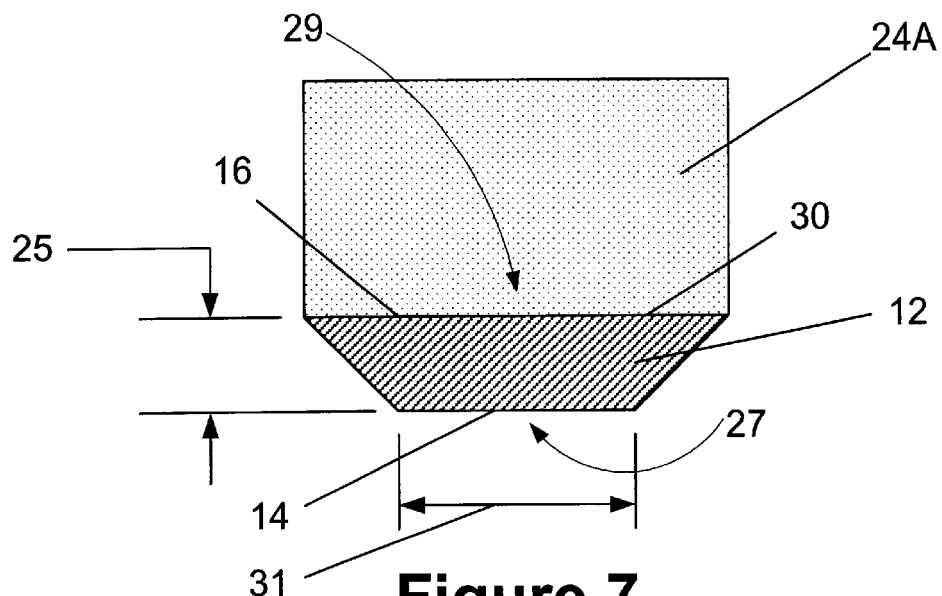
FIG. 7 is an enlarged view of an illustrative die having an adhesive layer attached thereto in accordance with one embodiment of the present invention.

The individual die 24 may then be removed from the cured wafer mount tape 10. When the die 24A is removed, there will be some degree of elastic recovery of the stretched adhesive layer 12. That is, as shown in FIG. 7, the adhesive layer 12 attached to the removed die 24A will have a bottom surface 14 that has a lateral dimension 31 that is smaller than a corresponding lateral dimension of the surface 16 of the adhesive layer 12 coupled to the bottom surface 30 of the die 24A. Stated another way, the surface 14 of the adhesive layer 12 coupled to the die 24A will have a surface area 27 that is less than the area of the bottom surface 30 of the die 24A due to the elastic recovery of the stretched adhesive layer 12 when it is released from the wafer mount tape 10.

As stated previously, the degree of stretching of the wafer mount tape 10 and adhesive layer 12 may vary depending upon the particular application. However, the degree of stretching should be selected so as not to prevent the desired degree of elastic recovery of the adhesive layer 12 when it is released from the wafer mount tape 10. After elastic recovery, the adhesive layer 12 may have a thickness 25 that is less than the original thickness 15 of the adhesive layer 12 prior to stretching. For example, in the case where the original thickness 15 of the adhesive layer 12 ranged from approximately 75–250 $\mu$m, the thickness 25 may be on the order of 35–125 $\mu$m.

Figure 8:
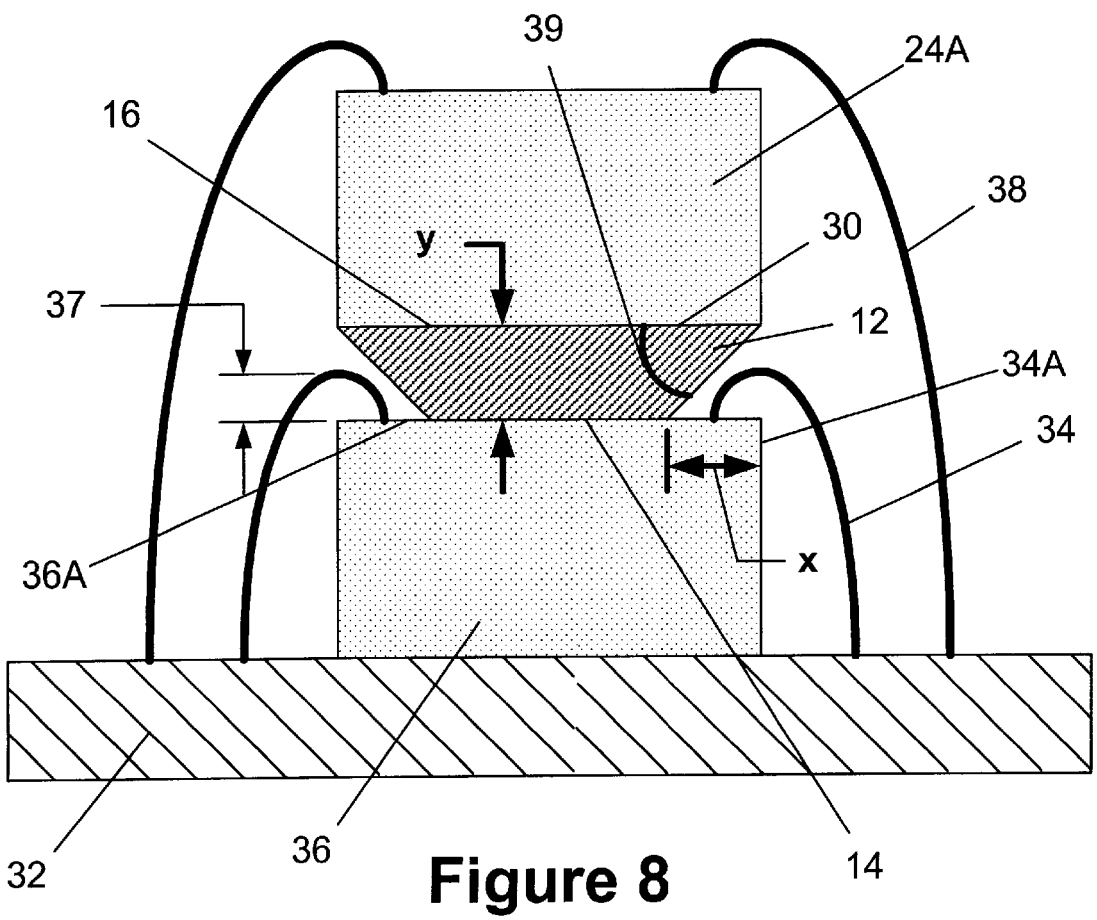
FIG. 8 is a cross-sectional view of a stacked die package in accordance with one illustrative embodiment of the present invention.

The present invention may be useful in the packaging of stacked semiconductor die, particularly die of the same approximate size. FIG. 8 depicts an illustrative example of such a packaging arrangement involving two die 36, 24A of approximately the same physical size. However, the present invention should not be considered as limited to the packaging of same size die unless such limitation is clearly set forth in the appended claims.

As shown in FIG. 8, a bottom die 36 is coupled to a substrate 32, e.g., a lead frame or laminate. A plurality of wire bonds 34 are coupled to the substrate 32 to bonding pads (not shown) on the upper surface 36A of the bottom die 36. The wire bonds 34 extend above the upper surface 36A of the bottom die 36 by a distance indicated by the arrow 37.

Of course, the magnitude of the distance 37 may vary depending upon the particular application. For example, in some applications, the distance 37 may be approximately 150 µm (6 mils). As will be recognized by those skilled in the art after a complete reading of the present application, the selection of material for the adhesive layer 12, its original thickness 15 and the degree of stretching must be such that, after the elastic recovery of the adhesive layer 12 occurs, the thickness 25 of the adhesive layer 12 attached to the die 24A will be sufficient to provide the necessary mechanical clearance for the wire bonds 34 coupled to the bottom die 36.

The die 24A, having the adhesive layer 12 attached thereto, may then be attached to the bottom die 36. More particularly, the bottom surface 14 of the adhesive layer 12 may be coupled to the upper surface 36A of the bottom die 36. The surface area 27 of the bottom surface 14 of the adhesive layer 12 coupled to the die 24A is such that it does not interfere with the wire bonds 34 or bonding pads (not shown) on the bottom die 36. In some embodiments, the surface 14 of the adhesive layer 12 may be sufficiently adhesive such that it may be directly attached to the upper surface 36A of the bottom die 36. Alternatively, or in addition to, an adhesive paste (not shown) may be used to secure the adhesive layer 12 to the bottom die 36. Thereafter, wire bonds 38 may be used to couple the die 24A to the substrate 32. In this manner, the engagement between the surface 16 of the adhesive layer 12 and the bottom surface 30 of the upper die 24A defines a first contact area, and the engagement between the surface 14 of the adhesive layer 12 defines a second contact area, wherein the second contact area is less than the first contact area.

Figure 9A:
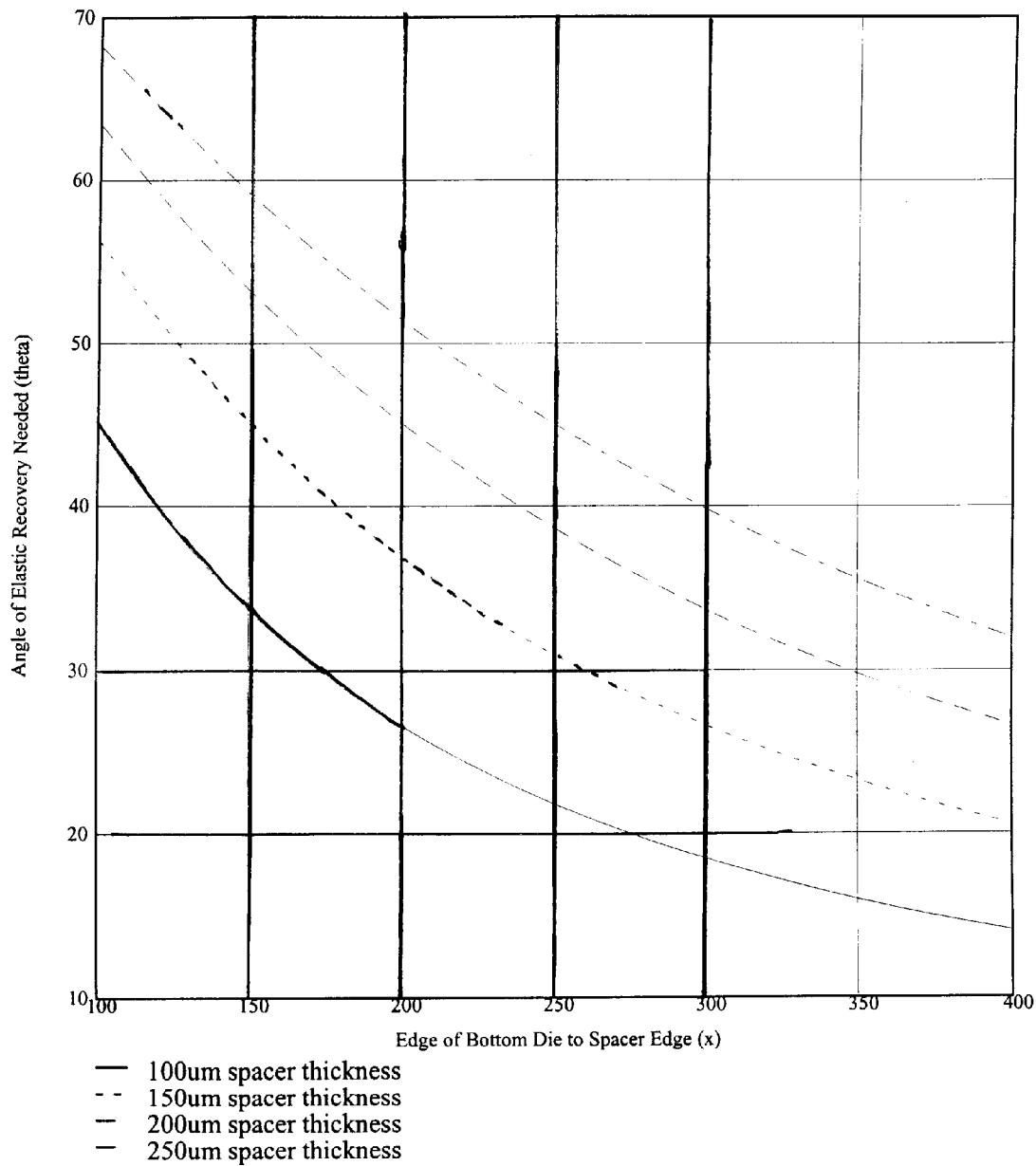
FIGS. 9A–9C are graphical depictions of various relationships between the thickness of the adhesive layer, its spacing from the edge of the bottom die and the angle of recovery of the adhesive film.
Figure 9B:
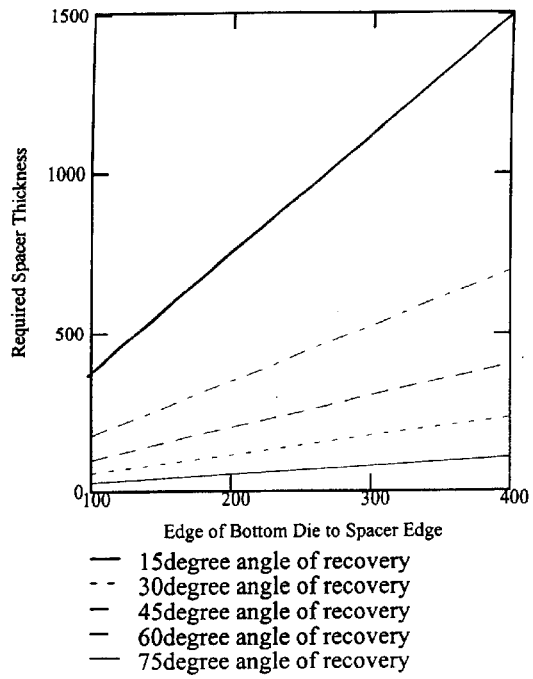
Figure 9C:
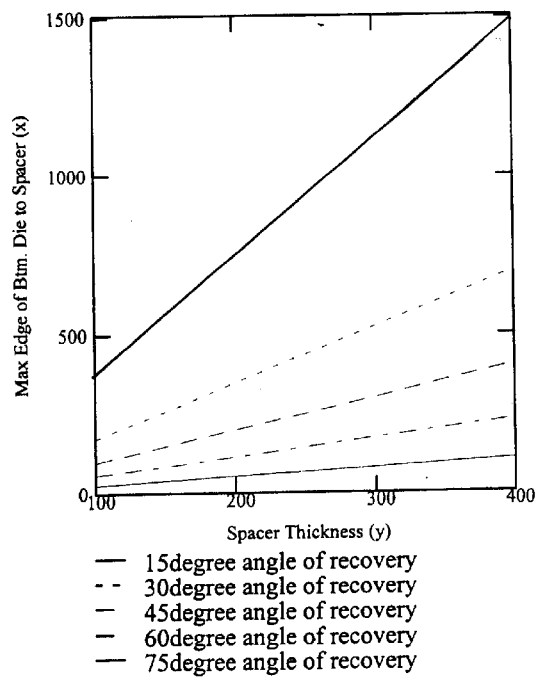

FIGS. 9A–9C graphically depict the various relationships between the thickness "y" of the adhesive layer 12, the distance "x" from the edge 34A of the bottom die 36, and the angle 39 (θ) of elastic recovery of the adhesive layer 12, as indicated on FIG. 8. FIG. 9A is a plot of "x" versus "θ" for various thicknesses "y" of the adhesive layer 12. FIG. 9B is a plot of "x" versus the required thickness "y" for various values for "θ." FIG. 9C is a plot of the thickness "y" versus "x" for various values of "θ." Through use of these plots, the parameters for the adhesive film 12 may be determined or adjusted.

In one illustrative embodiment, a method disclosed herein comprises providing a section of wafer mount tape 10, applying an adhesive layer 12 to the wafer mount tape 10, stretching the wafer mount tape 10 and the adhesive layer 12, attaching a wafer 22 to the stretched adhesive layer 12, cutting the wafer 22 and the adhesive layer 12, the wafer 22 being cut into a plurality of die 24, and curing the wafer mount tape 10. In further embodiments, the method is directed to removing at least one of the plurality of die 24 from the wafer mount tape 10, the removed die 24 having a portion of the adhesive layer 12 coupled thereto, providing a die 36 having a plurality of wire bonds 34 coupled thereto, and coupling the adhesive layer 12 on the removed die 24 to the die 36 having the wire bonds 34 coupled thereto.

In another aspect, the present invention is directed to a plurality of stacked semiconductor devices that comprise a first die 36, the first die 36 having an upper surface 36A, a second die 24A positioned above the first die 36, the second die 24A having a bottom surface 30, and an adhesive layer 12 positioned between and coupled to each of the first die 36 and the second die 24A, the adhesive layer 12 comprised of first and second surfaces, the first surface 16 of the adhesive layer 12 being coupled to the bottom surface 30 of the second die 24A thereby defining a first contact area, the second surface 14 of the adhesive layer 12 being coupled to the upper surface 36A of the first die 36 thereby defining a second contact area, the second contact area being less than the first contact area.

In yet another embodiment, the present invention is directed to a plurality of stacked semiconductor devices that comprise a first die 36, the first die 36 having an upper surface 36A, a second die 24A positioned above the first die 36, the second die 24A having a bottom surface 30, and an adhesive layer 12 positioned between and coupled to each of the first die 36 and the second die 24A, the adhesive layer 12 having a first surface 16 coupled to the bottom surface 30 of the second die 24A and a second surface 14 coupled to the upper surface 36A of the first die 36, the second surface 14 of the adhesive layer 12 having a lateral dimension 37 that is less than a lateral dimension of the first surface 16 of the adhesive layer 12.

Through use of the present invention, stacked semiconductor devices may be more efficiently packaged. As a result, manufacturing efficiencies and yields may be increased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a section of wafer mount tape;
   applying an adhesive layer to said wafer mount tape;
   stretching said wafer mount tape and said adhesive layer;
   attaching a wafer to said stretched adhesive layer;
   cutting said wafer and said adhesive layer, said wafer being cut into a plurality of die; and
   curing said wafer mount tape.

2. The method of claim 1, further comprising removing each of said plurality of die from said wafer mount tape, each of said die having a portion of said adhesive layer coupled thereto.

3. The method of claim 1, further comprising removing a die from said cured wafer mount tape, said removed die having a portion of said adhesive layer coupled thereto, said portion of said adhesive layer having a first surface in engagement with said die and a second surface opposite said first surface that is not engaged with said removed die, said second surface having a lateral dimension that is less than a lateral dimension of said first surface.

4. The method of claim 1, further comprising removing a die from said cured wafer mount tape, said removed die having a portion of said adhesive layer coupled thereto, said portion of said adhesive layer having a first surface in engagement with said removed die and a second surface opposite said first surface that is not engaged with said removed die, said second surface defining an area that is less than an area defined by said first surface.

5. The method of claim 1, further comprising:
   removing a die from said wafer mount tape, said removed die having a portion of said adhesive layer coupled thereto;

providing a die having a plurality of wire bonds coupled thereto; and coupling said adhesive layer on said removed die to said die having said wire bonds coupled thereto.

6. The method of claim 1, wherein applying an adhesive layer to said wafer mount tape comprises applying an adhesive film to said wafer mount tape.

7. The method of claim 1, wherein applying an adhesive layer to said wafer mount tape comprises applying a liquid adhesive material to said wafer mount tape and curing said liquid adhesive.

8. The method of claim 1, wherein stretching said wafer mount tape and said adhesive layer comprises stretching said wafer mount tape and said adhesive layer by an amount ranging from approximately 200–800%.

9. The method of claim 1, wherein attaching a wafer to said stretched adhesive layer comprises attaching a wafer to said stretched adhesive layer by urging said wafer into engagement with sa id adhesive layer.

10. The method of claim 1, wherein attaching a wafer to said stretched adhesive layer comprises attaching a wafer to said stretched adhesive layer by applying an adhesive paste to at least one of said wafer and said adhesive layer and urging said wafer into engagement with said adhesive layer.

11. A method, comprising:

providing a section of wafer mount tape;

applying an adhesive layer to said wafer mount tape;

stretching said wafer mount tape and said adhesive layer;

attaching a wafer to said stretched adhesive layer;

cutting said wafer and said adhesive layer, said wafer being cut into a plurality of die;

curing said wafer mount tape;

removing at least one of said plurality of die from said wafer mount tape, said removed die having a portion of said adhesive layer coupled thereto;

providing a die having a plurality of wire bonds coupled thereto; and coupling said adhesive layer on said removed die to said die having said wire bonds coupled thereto.

12. The method of claim 11, wherein said portion of said adhesive layer has a first surface in engagement with said die and a second surface opposite said first surface that is not engaged with said removed die, said second surface having a lateral dimension that is less than a lateral dimension of said first surface.

13. The method of claim 11, wherein said portion of said adhesive layer has a first surface in engagement with said removed die and a second surface opposite said first surface that is not engaged with said removed die, said second surface defining an area that is less than an area defined by said first surface.

14. The method of claim 11, wherein applying an adhesive layer to said wafer mount tape comprises applying an adhesive film to said wafer mount tape.

15. The method of claim 11, wherein applying an adhesive layer to said wafer mount tape comprises applying a liquid adhesive material to said wafer mount tape and curing said liquid adhesive.

16. The method of claim 11, wherein stretching said wafer mount tape and said adhesive layer comprises stretching said wafer mount tape and said adhesive layer by an amount ranging from approximately 200–800%.

17. The method of claim 11, wherein attaching a wafer to said stretched adhesive layer comprises attaching a wafer to said stretched adhesive layer by urging said wafer into engagement with said adhesive layer.

18. The method of claim 11, wherein attaching a wafer to said stretched adhesive layer comprises attaching a wafer to said stretched adhesive layer by applying an adhesive paste to at least one of said wafer and said adhesive layer and urging said wafer into engagement with said adhesive layer.

19. A method, comprising:

providing a section of wafer mount tape;

applying an adhesive layer to said wafer mount tape;

stretching said wafer mount tape and said adhesive layer;

attaching a wafer to said stretched adhesive layer;

cutting said wafer and said adhesive layer, said wafer being cut into a plurality of die;

curing said wafer mount tape;

removing at least one of said plurality of die from said wafer mount tape, said removed die having a portion of said adhesive layer coupled thereto, said portion of said adhesive layer having a first surface in engagement with said removed die and a second surface opposite said first surface that is not engaged with said removed die, said second surface defining an area that is less than an area defined by said first surface;

providing a die having a plurality of wire bonds coupled thereto; and coupling said second surface of said adhesive layer on said removed die to said die having said wire bonds coupled thereto.

20. The method of claim 19, wherein applying an adhesive layer to said wafer mount tape comprises applying an adhesive film to said wafer mount tape.

21. The method of claim 19, wherein applying an adhesive layer to said wafer mount tape comprises applying a liquid adhesive material to said wafer mount tape and curing said liquid adhesive.

22. The method of claim 19, wherein stretching said wafer mount tape and said adhesive layer comprises stretching said wafer mount tape and said adhesive layer by an amount ranging from approximately 200–800%.

23. The method of claim 19, wherein attaching a wafer to said stretched adhesive layer comprises attaching a wafer to said stretched adhesive layer by urging said wafer into engagement with said adhesive layer.

24. The method of claim 19, wherein attaching a wafer to said stretched adhesive layer comprises attaching a wafer to said stretched adhesive layer by applying an adhesive paste to at least one of said wafer and said adhesive layer and urging said wafer into engagement with said adhesive layer.

* * * * *